(12) United States Patent
Lhermet

(10) Patent No.: US 11,008,213 B2
(45) Date of Patent: May 18, 2021

(54) MICROELECTROMECHANICAL AND/OR NANOELECTROMECHANICAL DEVICE OFFERING IMPROVED ROBUSTNESS

(71) Applicant: COMMISSARIAT A L'ENERGIE ATOMIQUE ET AUX ENERGIES ALTERNATIVES, Paris (FR)

(72) Inventor: Helene Lhermet, Meylan (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 293 days.

(21) Appl. No.: 16/215,925

(22) Filed: Dec. 11, 2018

(65) Prior Publication Data
US 2019/0177153 A1 Jun. 13, 2019

(30) Foreign Application Priority Data
Dec. 12, 2017 (FR) ...................... 17 61989

(51) Int. Cl.
*G01L 1/18* (2006.01)
*B81B 3/00* (2006.01)
*G01P 15/12* (2006.01)

(52) U.S. Cl.
CPC .......... *B81B 3/0018* (2013.01); *B81B 3/0051* (2013.01); *B81B 3/0078* (2013.01); *G01L 1/18* (2013.01); *G01P 15/123* (2013.01); *B81B 2201/0228* (2013.01); *B81B 2203/0118* (2013.01); *B81B 2203/0163* (2013.01);
(Continued)

(58) Field of Classification Search
None
See application file for complete search history.

(56) References Cited

U.S. PATENT DOCUMENTS

| 6,546,801 B2* | 4/2003 | Orsier ................... B81B 3/0051 |
| | | 73/514.29 |
| 9,448,126 B2* | 9/2016 | Dehe ...................... G01L 9/0073 |
| 9,995,583 B2* | 6/2018 | Rocchi ............... G01C 19/5769 |

(Continued)

FOREIGN PATENT DOCUMENTS

| EP | 2 491 406 A1 | 8/2012 |
| WO | WO 2007/136096 A1 | 11/2007 |

OTHER PUBLICATIONS

French Preliminary Search Report dated Oct. 22, 2018 in French Application 17 61989, filed on Dec. 12, 2017 (with English Translation of Categories of Cited Documents).

*Primary Examiner* — Peter J Macchiarolo
*Assistant Examiner* — Jermaine L Jenkins
(74) *Attorney, Agent, or Firm* — Oblon, McClelland, Maier & Neustadt, L.L.P.

(57) ABSTRACT

A microelectromechanical and/or nanoelectromechanical device having a fixed part, at least one suspended part configured to be moveable in the plane of the device with respect to the fixed part along at least one first direction and a first suspension means for suspending the suspended part. The first suspension means includes two suspension elements each having a first end fixed directly to the suspended part and a second end connected to the fixed part, each suspension element having a half-ellipse shape in the plane and extending between the first end and the second end, and the two suspension elements being arranged with respect to each other so as to form an ellipse.

17 Claims, 8 Drawing Sheets

(52) U.S. Cl.
CPC . *B81B 2203/0172* (2013.01); *B81B 2203/051* (2013.01); *B81B 2207/053* (2013.01)

(56) References Cited

U.S. PATENT DOCUMENTS

| | | | | |
|---|---|---|---|---|
| 10,121,623 | B2 * | 11/2018 | Blondy | H01H 59/0009 |
| 10,466,053 | B2 * | 11/2019 | Ruohio | G01C 19/5747 |
| 10,710,870 | B2 * | 7/2020 | Hennes | G01P 15/131 |
| 2016/0349056 | A1 | 12/2016 | Thompson et al. | |

* cited by examiner

MICROELECTROMECHANICAL AND/OR NANOELECTROMECHANICAL DEVICE OFFERING IMPROVED ROBUSTNESS

TECHNICAL FIELD AND PRIOR ART

The present invention relates to a microelectromechanical and/or nanoelectromechanical device offering increased flexibility and robustness.

Microelectromechanical system (MEMS) and/or nanoelectromechanical system (NEMS) devices are used to produce miniaturised sensors such as accelerometers, gyrometers, pressure sensors, microphones, and miniaturised actuators for example to produce orientable micro-mirrors.

MEMS and/or NEMS devices comprise at least one suspended moveable element. In the case of an accelerometer, the moveable element or mass is displaced under the effect of an acceleration force. Its displacement is measured, which makes it possible to determine the acceleration value.

MEMS and/or NEMS devices may implement suspension means S comprising beams connected together by their ends in zigzag shape, as is represented in FIG. 1A. During the displacement of the moveable element, the suspension means deform: the beams move away from or come closer to each other. A concentration of strains appears at the level of the connection of the beams. Such devices may be used to produce sensors, to do so means for detecting the displacement of the moveable element are implemented, for example piezoresistive gauges.

FIG. 1B represents a sensor with MEMS and NEMS piezoresistive detection described in the document EP2491406. The sensor comprises a moveable mass M forming the MEMS part rotationally hinged by a hinge CH with respect to a fixed part around an axis orthogonal to the plane of the substrate. Under the effect of an acceleration of given direction, the mass M is rotationally displaced in the plane. Piezoresistive nanogauges NJ, forming the NEMS part, are suspended between the mass and the fixed part with respect to the substrate so as to be deformed during the displacement of the mass in the plane. The arrangement of the nanogauges NJ and the position of the centre of gravity of the mass with respect to the axis of rotation are such that a lever arm effect appears, which has an amplifying effect on the deformation of the gauges, increasing the sensitivity of the sensor.

This device gives satisfaction. However the implementation of a hinge or pivot joint between the mass and the fixed part can reduce the flexibility and the robustness of the sensor, indeed the device may be weakened at the level of the hinge. Moreover, there may be a concentration of strain at the level of the hinge.

DESCRIPTION OF THE INVENTION

It is consequently an aim of the present invention to offer a MEMS and/or NEMS device offering increased flexibility and robustness.

The aforesaid aim is attained by a device comprising a fixed part with respect to the substrate and a part suspended with respect to said fixed part by suspension means, said suspended part being intended to be displaced in the plane of the device. The suspension means comprise at least one element connected by a first end directly to the suspended part and by a second end to the fixed part, said element comprising a curved shape extending from its first end to its second end.

The suspension element is intended to be loaded only in an elastic manner. It does not comprise several portions connected so as to form angular zones. Thus, it does not comprise a fragile zone and has great robustness.

The suspension means of curved shape ensure guiding, by introducing flexibility in the desired direction of displacement, and stiffness in the two other directions.

An increased flexibility of the suspension in the desired direction results from the implementation of suspension means of curved shape. Indeed, the elastic deformation is distributed over the whole of the curved shape. Thus, each point of the curved shape remains in the very linear elastic part of the deformation curve of the material as a function of the applied strain, introducing fewer mechanical losses and thus lower dampening of the movement by the suspension. On the contrary, in suspensions of the prior art, locally, i.e. in the pivot points, the zone of non-linearity of the deformation curve may be reached.

The result is also, and for the aforesaid reasons, greater robustness of the suspension.

In an advantageous embodiment, the suspension means comprise two elements arranged so as to form substantially an ellipse. Strains are then spread out in the elliptical suspension. The device then has increased robustness.

In a particularly advantageous embodiment, one or more strain gauges, for example piezoresistive or piezoelectric gauges, are implemented, for example in detection means. The gauges are advantageously associated directly with the elliptical suspension means, such that there is an amplifying or reducing effect between the amplitude of displacement of the moveable mass and the amplitude of displacement at the level of the detection means. For example, the detection means comprise at least one strain gauge, the deformation applied to the gauge being able to be amplified.

With respect to sensors in which the mass is rotationally moveable and of which the detection uses a lever arm, the device according to an example of the invention benefits from an amplification effect and thus has increased sensitivity, without implementing a pivot joint.

Moreover, the sensor according to the invention is of simpler design than those of the prior art with lever arm, because couplings between the dimensioning variables are fewer than in the case of sensors implementing a lever arm.

The invention further has the advantage of being able to be realised with microelectronic methods normally implemented for devices of the prior art.

The subject matter of the application is a microelectromechanical and/or nanoelectromechanical device comprising a fixed part, at least one suspended part intended to be moveable in the plane of said device with respect to the fixed part along at least one first direction, a first means for suspending said suspended part, said first suspension means comprising at least one suspension element, said suspension element comprising a first end fixed directly to the suspended part and a second end connected to the fixed part, said suspension element having a curved shape contained in the plane and extending between the first end and the second end and such that during the displacement in the plane of said suspended part, said suspension element is only deformed elastically.

Said at least one suspension element is for example of half-ellipse shape. Advantageously, the device comprises two suspension elements, each of half-ellipse shape, and arranged with respect to each other so as to form an ellipse.

In an exemplary embodiment, the device comprises a second suspension means comprising at least one element for suspending said suspended part from said fixed part, said suspension element comprising a first end fixed directly to the suspended part, and a second end connected to the fixed part, said suspension element having a curved shape contained in the plane, and extending between the first end and the second end such that, during the displacement in the plane of said suspended part, said suspension element is only deformed elastically, said second suspension means being arranged with respect to the moveable part and to the first suspension means, such that, during a displacement of the moveable part, when the first suspension means is deformed in compression, the second suspension means is deformed in traction and vice versa.

The device may comprise at least one strain gauge, of which one of the ends is fixed on the suspension element and the other is anchored on the fixed part with respect to the substrate, advantageously at least two strain gauges each being fixed to a suspension element.

According to an exemplary embodiment, the first suspension means and/or the second suspension means is (are) oriented such that their major axis (a) is parallel to the first direction, and at least one strain gauge is aligned with the minor axis, such that the moveable end of the strain gauge undergoes a displacement amplified with respect to that of the moveable part.

In a particular example the first suspension means and/or the second suspension means and/or the third suspension means comprise a first elliptically shaped element and a second elliptically shaped element arranged in the first elliptically shaped element and mechanically connected thereto, the first elliptically shaped element being fixed on the moveable part and the second elliptically shaped element being fixed only on the first elliptically shaped element. At least one strain gauge is fixed to the second elliptically shaped element.

The device may comprise several moveable parts, each moveable part being connected to the fixed part with respect to the substrate by at least one first suspension means. At least one strain gauge is suspended between two first suspension means.

Another subject matter of the application is a sensor comprising at least one device according to the invention, and comprising means for detecting the displacement of the moveable part.

The means for detecting the displacement of the moveable part may comprise at least one strain gauge, said strain gauge being a piezoresistive gauge. Advantageously, it comprises two strain gauges differentially connected and being arranged such that, when one undergoes a compression, the other undergoes a traction.

The sensor may be a microphone, in which the moveable part is a diaphragm.

The sensor may be an accelerometer, in which the moveable part is sensitive to the forces resulting from an acceleration.

The sensor may be a gyrometer, comprising several parts suspended by suspension elements of curved shape.

Another subject matter of the application is an actuator comprising at least one device according to invention, and comprising means for displacing the suspended part.

BRIEF DESCRIPTION OF THE DRAWINGS

The present invention will be better understood on the basis of the description that follows and from the appended drawings in which.

DETAILED DESCRIPTION OF PARTICULAR EMBODIMENTS

In the description that follows, a MEMS and/or NEMS device will be designated by MEMS device for reasons of simplicity.

The MEMS device according to the invention may be a sensor or an actuator.

Moreover, the MEMS device comprises at least one part intended to be displaced with respect to the substrate, it will be designated "moveable part", "moveable element", "mass", "inertial mass" or "proof body".

Figure 1A:
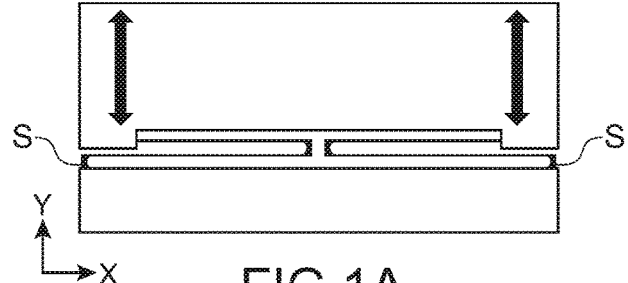
FIG. 1A is a schematic top view representation of a suspension of the prior art.
Figure 1B:
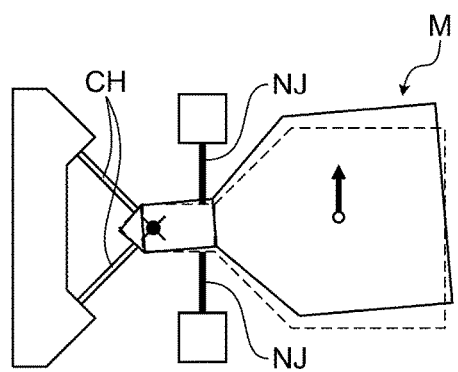
FIG. 1B is a schematic top view representation of an example of sensor in the plane with piezoresistive detection of the prior art implementing another suspension than that of FIG. 1A.
Figure 2A:
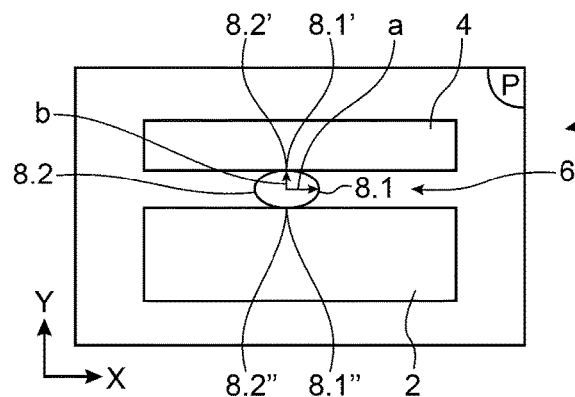
FIG. 2A is a schematically represented top view of an example of MEMS and/or NEMS device according to the invention, FIG. 2A' is a side view of the device of FIG. 2A, FIG. 2B a view of the device of FIG. 2A with the suspension means in the deformed state.
Figure 2A:
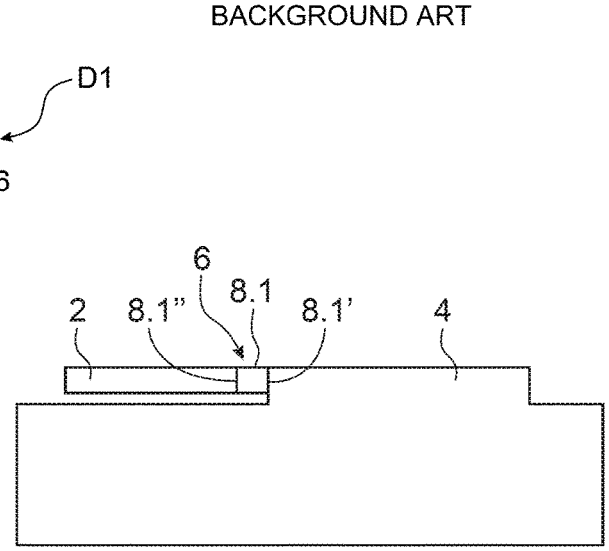

In FIG. 2A may be seen an example of a MEMS device D1 according to the invention, in a top view, comprising a part 2 suspended from a fixed part 4. The fixed part is mechanically fixed with respect to the substrate but may be electrically isolated or not therefrom. The suspended part 2 may be electrically connected or not to the fixed part 4. The suspended part 2 is intended to be moveable with respect to the fixed part 4 in the plane P of the device. The suspended part 2 may be made to move by an external force, such as a force resulting from an acceleration, or be voluntarily made to move for example by an electrostatic force, by applying a difference in electrical potential or by injecting an electrical current.

In FIG. 2A' may be seen a side view of the device D1.

The plane of the device is the plane extending along the X and Y axes in the representation of FIG. 2A. The out-of-plane direction is the direction orthogonal to the plane P.

The device D1 comprises first suspension means 6 mechanically connecting the suspended part 2 to the fixed part 4, while enabling it to be displaced in the plane P.

The first suspension means 6 comprise two elements 8.1, 8.2 each of curved shape.

In the example represented, the elements 8.1 and 8.2 are of semi-elliptical or substantially semi-elliptical shape. The elements 8.1 and 8.2 are arranged with respect to each other so as to form an ellipse or substantially an ellipse.

The element 8.1 is reconnected to the suspended part 2 by a first end 8.1' and to the fixed part by a second end 8.1". The element 8.2 is reconnected to the suspended part 2 by a first end 8.2' and to the fixed part by a second end 8.2". The ends 8.1' and 8.2' are connected to each other and the ends 8.1" and 8.2" are connected to each other.

In the present application, "curved element" is taken to mean an element of curved shape of which the shape in the plane P may be described by an arc between its two ends which are connected on the one hand to the moveable part and on the other hand to the fixed part, directly or indirectly. The element of curved shape does not have an angular zone capable of concentrating strains and becoming a zone of weakness.

The curved or bent shape may be an arc of ellipse, for example a semi-ellipse. The ellipse portion may be derived from an ellipse comprising a major axis, a minor axis and two distinct centres or from a circle and thus be an arc of circle.

It will be understood that on account of the production methods, the suspension elements do not necessarily have perfectly curved shapes.

Figure 13A:
FIGS. 13A to 13C are schematic representations of different examples of suspension means according to the invention.
Figure 13B:
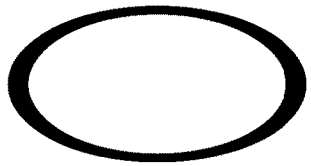
Figure 13C:

In FIGS. 13A to 13C may be seen different examples of suspension means according to the invention. In FIG. 13A, the suspension means are of ellipse shape and have a substantially constant thickness.

In FIG. 13B, the suspension means are of ellipse shape and have a variable thickness, for example it has a greater thickness at the level of the ends of the major axis. This thickness distribution makes it possible to spread out strains, for example in order to stiffen certain parts of the structure.

In FIG. 13C, the suspension means have a general ellipse shape, formed by a succession of segments, the segments being of very small length, the element thereby formed is comparable to an ellipse. Deformations are distributed over the connections between the segments.

The ellipse comprises a minor axis b and a major axis a.

Figure 2B:
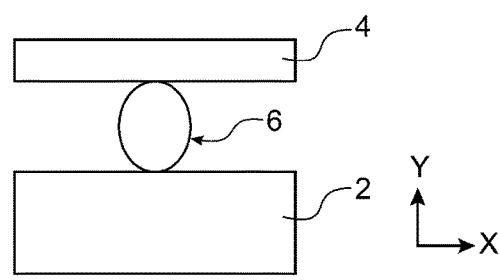
FIG. 2C is a schematically represented top view of a variant of the MEMS and/or NEMS device of FIG. 2A.

When a displacement force is applied to the suspended part 2 along a Y axis parallel to the axis passing through the minor axis b, it is displaced along the Y axis and the ellipse deforms, as is represented in FIG. 2B. The moveable part 2 may be displaced by moving away from and by moving closer to the fixed part 4 along the Y axis.

The elements 8.1 and 8.2 are deformed elastically.

In this exemplary embodiment, the moveable part 2 is only suspended by the suspension means 6.

The suspension means 6 only comprise curved shapes and not angular zones, they do not have zones capable of concentrating strains and being weakened. The suspension means are thus more robust.

In the case of the ellipse, strain is distributed more uniformly, making the suspension means more robust.

In the example represented, the suspension means comprise two elements of curved shape. In another example, the suspension means comprise a single element of curved shape such as the element 8.1.

Figure 2C:
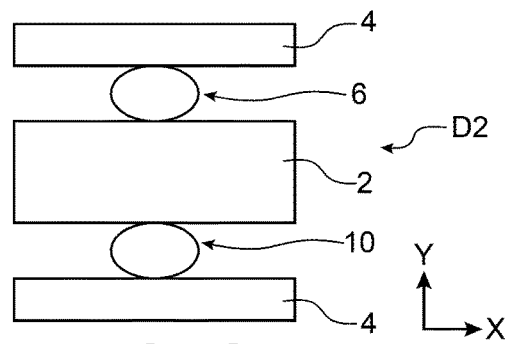

In FIG. 2C may be seen a device D2 according to a variant embodiment of the device D1, comprising second suspension means 10 situated opposite the first suspension means 6 with respect to the moveable element 2, and also suspending the moveable part from the fixed part 4. The guiding of the moveable part along the direction Y is improved.

In the example represented, the second suspension means 10 also have an elliptical or substantially elliptical shape. In this variant, the ellipses of the first and second suspension means are of similar or identical dimensions. According to another variant, the first and second suspension means are of different dimensions. In yet another variant, the second suspension means are of known type formed by springs for example of coil shape that will be described below. In a further variant, the suspension means comprise a single element of curved shape.

When a force is applied to the moveable element 2 along the Y axis, the first suspension means 6 are deformed in elongation or in compression along the Y axis, and the second suspension means are deformed in the opposite sense, in compression or in elongation along the Y axis.

The devices D1 and D2 may be implemented in a sensor or an actuator.

Figure 3:
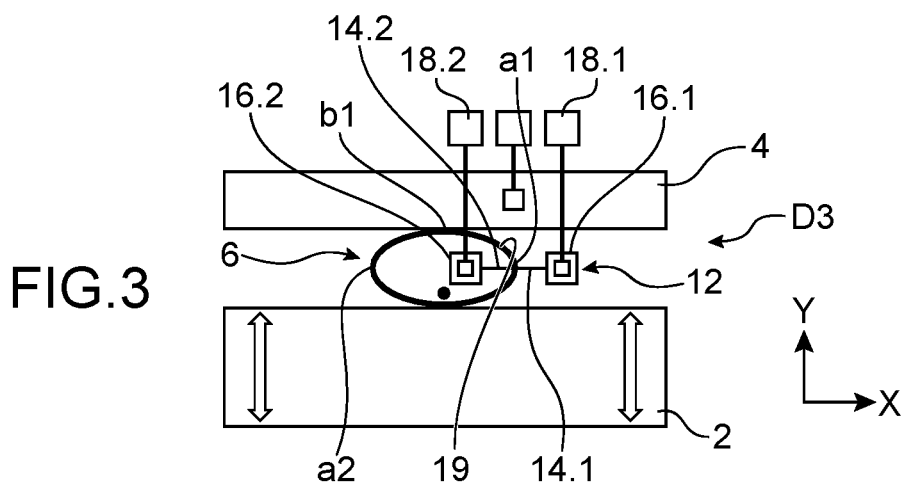
FIG. 3 is a schematically represented top view of an example of sensor according to the invention.

In FIG. 3 may be seen an example of MEMS and/or NEMS sensor D3 according to the invention. The sensor is for example an accelerometer intended to measure accelerations. The suspended part is generally designated mass or proof body.

The structure of the sensor D3 reproduces the structure of the device D1 and further comprises means 12 for detecting the displacement of the moveable mass 2.

In this exemplary embodiment, it is wished to detect the displacement of the mass 2 along the direction Y. The detection means are thus such that they detect the displacement of the mass along the direction Y.

In this example, the detection means 12 comprise two strain gauges 14.1, 14.2, preferably piezoresistive gauges.

Preferably, the gauges are aligned on the major axis a parallel to the direction X orthogonal to the direction Y of displacement.

The ends of the major axis a on the ellipse are designated a1 and a2.

Each gauge 14.1, 14.2 is suspended between the ellipse at the point a1 and an anchoring pad 16.1, 16.2. The anchoring pads 16.1, 16.2 are arranged along a straight line (d) containing the major axis a, on either side of the point a1.

The anchoring pads also form contact pads which are connected to electrical contacts 18.1, 18.2, making it possible to apply a potential to the gauges.

The proof body, the suspension and the fixed part are connected to an electrical contact 19.

The arrangement of the gauges is such that when one is stretched, the other is compressed. This arrangement, associated with a suitable power supply and an electrical measurement via the electrical connexions, makes it possible to carry out a differential measurement of the strains generated in the two gauges.

As is represented in FIG. 3, when the mass is displaced along the Y axis in moving away from the fixed part 2, the ellipse lengthens along the minor axis b, and the points a1 and a2 of the major axis come closer to the minor axis b, the result is a traction loading of the gauge 14.1 and a compression loading of the gauge 14.2.

Moreover, on account of the ellipse shape and the orientation thereof with respect to the direction of displacement, the result is a reduction in the amplitude of the displacement of the point a1 with respect to the displacement of the point b1, which is the end of the minor axis on the side of the fixed part 4. Indeed the variations in length of the major axis and of the minor axis are linked. Let lb be the length of the minor axis, dlb the variation in length of the minor axis, la the length of the major axis, dla the variation in length of the major axis, then $$dla = lb/la \; dlb.$$

Consequently, as a function of the orientation of the ellipse and the arrangement of the gauges, it is possible either to amplify the amplitude of the displacement to detect, or to reduce it. In the case of a circle, the amplitude of the deformation transmitted from one axis to the other is the same.

In the example of D3, since the mass is displaced along the minor axis and the gauge is loaded along the major axis, the amplification ratio is below 1, the displacement of the end of the gauge connected to the elliptical element is less than that of the mass. This configuration makes it possible for example to limit deformation of the gauge in the case of important displacements of the mass.

The sensor D3 according to the invention, in which the mass is translationally displaced, offers greater robustness with respect to sensors implementing a mass rotationally moveable in the plane. Indeed, this sensor does not implement suspension means having zones where strains can be concentrated.

In addition, the elliptical shape makes it possible to have a mechanical efficiency, with respect to the energy transmitted to the strain gauge, substantially greater than that obtained with a shape including pivot links, because the elastic deformation is distributed over the whole of the elliptical shape and not localised in the pivot links. For example, in the case of an elliptical shape, the efficiency is of the order of 80%-90%, whereas for a shape including pivot links it is of the order of 40%-50%.

Moreover, the sensor D3 has the advantage of being of simpler design than a sensor with rotationally hinged mass. Indeed, in the case of sensors with rotationally hinged mass, couplings between dimensioning variables are numerous and complicate the design of the sensors. For example, the lever arm effect that intervenes in the structure of sensors with rotationally hinged mass and that ensures an amplifying effect on the sensitivity is difficult to implement on account of technological constraints which limit the values of the distance between the pivot and the strain gauge.

In the sensor according to the invention, couplings between dimensioning variables are fewer: the amplification coefficient depends on the geometry of the ellipse. The dimensioning of the sensor is then facilitated by this separation of variables.

Figure 4:
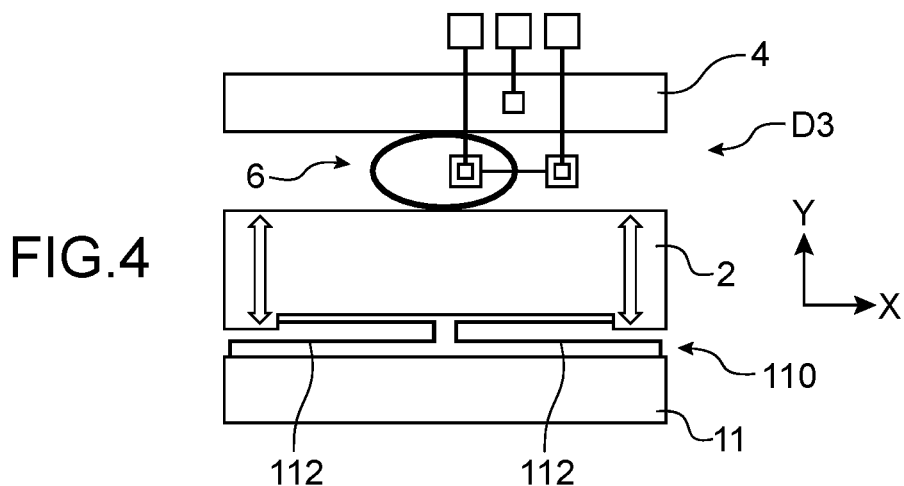
FIG. 4 is a schematically represented top view of a variant of the sensor of FIG. 3.

In FIG. 4 may be seen another example of sensor D4 according to the invention.

The sensor D4 differs from the sensor D3 in that it comprises second suspension means 110 situated opposite the first suspension means 6 with respect to the moveable element 2, and also suspending the moveable element from another fixed part 11 with respect to the substrate.

In the example represented, the second suspension means comprise coil shaped springs 112.

The implementation of these second suspension means makes it possible to constrain the displacement of the mass along the direction Y, limiting parasitic displacements along the direction X and also out-of-plane displacements in the direction Z orthogonal to the directions X and Y.

The sensor D4 is thus less sensitive to accelerations along the directions X and Z than the sensor D3.

According to a variant, the second coil shaped suspension means 110 are replaced by an ellipse.

Figure 5:
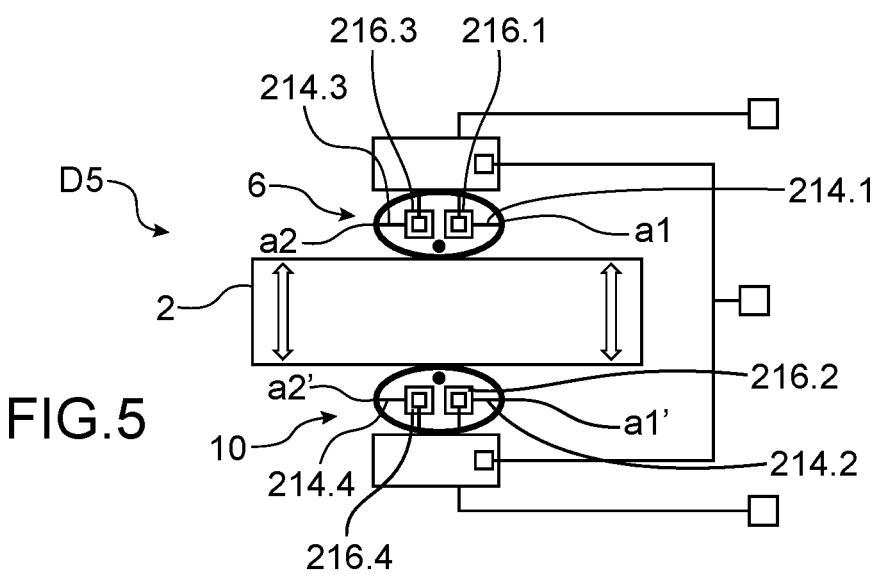
FIG. 5 is a schematically represented top view of another example of sensor according to the invention.

In FIG. 5 may be seen another example of sensor D5 according to the invention.

The moveable mass 2 of the sensor D5 is suspended by first and second suspension means 6 and 10 of elliptical or substantially elliptical shape fixed to the mass on the sides opposite to it.

In this example, the means for detecting the displacement of the mass are distributed in the first and second suspension means.

It comprises a first gauge 214.1 suspended between an anchoring pad 216.1 situated in the ellipse of the first suspension means and the point a1 of the ellipse of the first suspension means. It also comprises a second gauge 214.2 suspended between an anchoring pad 216.2 situated in the ellipse of the second suspension means and the point a1' of the ellipse of the second suspension means. The anchoring pads 216.1, 216.2 are electrically connected to electrical contacts and are differentially mounted. Preferably, each first and second gauge is aligned with the major axis of the ellipse from which it is suspended.

In the example represented and advantageously, the sensor comprises a third gauge 214.3 suspended between an anchoring pad 216.3 situated in the ellipse of the first suspension means and the point a2 of the ellipse of the first suspension means, and a fourth gauge 214.4 suspended between an anchoring pad 216.4 situated in the ellipse of the second suspension means and the point a2' of the ellipse of the second suspension means.

The third gauge 214.3 is aligned with the first gauge 214.1 and the fourth gauge 214.4 is aligned with the second gauge 214.2. In the example represented, the third 214.3 and fourth 214.4 gauges do not participate in the detection, but their presence ensures symmetry of the structure, which makes it possible to mechanically balance the structure during operation. The anchoring pads 216.3 and 216.4 are not electrically connected to electrical contacts.

In a variant, the detection means implement the four gauges 214.1, 214.2, 214.3 and 214.4.

According to another variant, the sensor only comprises the gauges 214.1 and 214.2.

The operation of the sensor D5 will now be described.

When an acceleration along Y, downwards in the representation of FIG. 5, is applied to the sensor, the mass is displaced downwards, the ellipse of the first suspension means is stretched along the Y axis whereas the ellipse of the second suspension means is compressed along the Y axis.

The first gauge 214.1 is then compression loaded and the second gauge 214.2 is traction loaded. A differential measurement is then obtained.

This sensor has the advantage of being not very sensitive to accelerations along the directions X and Z.

Figure 6:
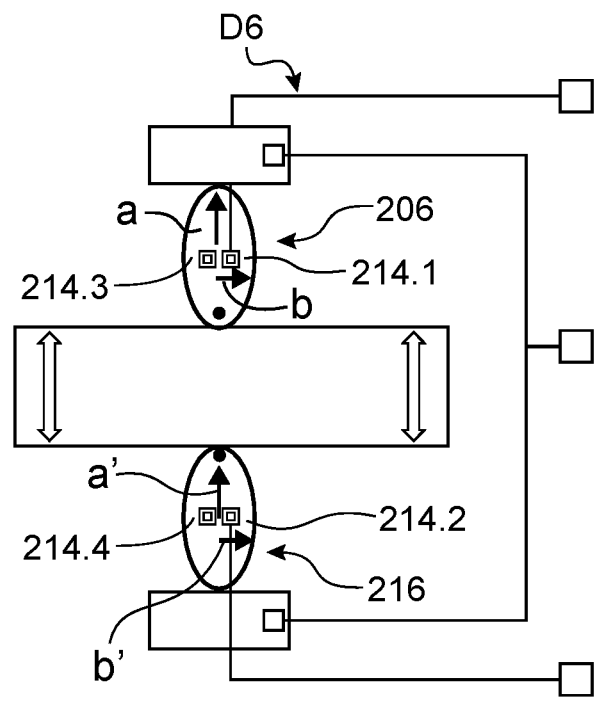
FIG. 6 is a schematically represented top view of a variant of the sensor of FIG. 5, FIGS. 7A and 7B are schematically represented top views of sensors according to the invention, with numerical displacement examples.

In FIG. 6 may be seen another example of sensor D6 according to the invention.

The structure of the sensor D6 differs from that of the sensor D5 in that the ellipses of the first suspension means 206 and of the second suspension means 210 are arranged such that it is their major axis a, a' that is aligned with the axis of displacement Y and no longer their minor axis b, b'.

The first gauge 214.1 is aligned with the minor axis b and the second gauge 214.2 is aligned with the minor axis b'.

Advantageously, third and fourth gauges are provided to balance the structure.

Due to the orientation of the suspension means, the variation in length that applies to the gauge 214.1 is written dlb/2=½ la/lb dla. Similarly for the gauge 214.2, the variation in length is written dlb'/2=½ la'/lb' dla', la' and lb' being the length of the axes a' and b' respectively.

Yet la being greater than lb and la' being greater than lb', the ratios la/lb and la'/lb' are greater than 1. For an amplification ratio greater than 2, the result is thus an amplification of the displacement of the moveable part transmitted to the gauges 214.1, 214.2.

Figure 7A:
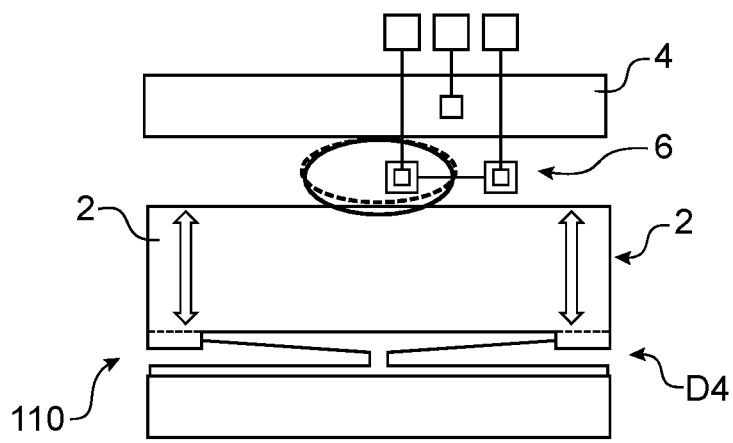
Figure 7B:
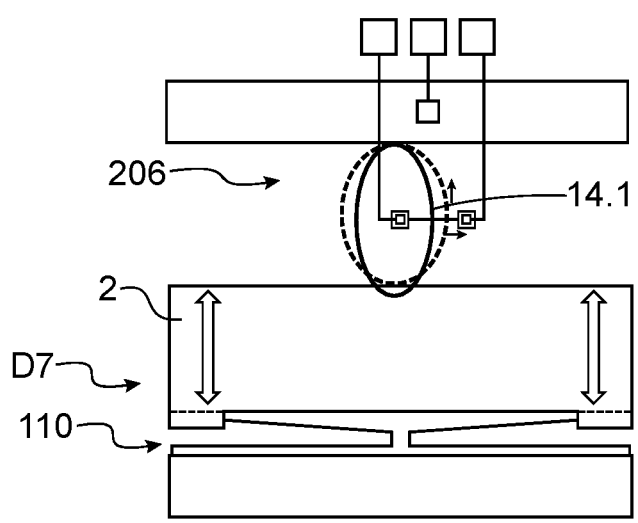

In FIGS. 7A and 7B may be seen the sensor D4 and a sensor D7 which differs from the sensor D4 by the orientation of the ellipse of the first suspension means.

Examples of dimensioning and displacement are presented by way of illustration.

The two structures have a ratio la/lb=5.

For the sensor D4, it is a reduction ratio and for the sensor D7 it is an amplification ratio.

For the sensor D4, a displacement of the point 131 along the direction Y of 2 µm causes a displacement of the point a1 along the X axis of 0.2 µm. The length of the minor axis varies by 2 µm and the length of the major axis varies by 0.4 µm.

For the sensor D7, a displacement of the point b1 along the direction Y of 0.08 µm causes a displacement of the point a1 along the X axis of 0.2 µm. The length of the minor axis varies by 0.08 µm and the length of the major axis varies by 0.4 µm.

For a same displacement of the point a1, the displacement along Y is much smaller for the sensor D7, and more generally for a sensor of which the ellipse is oriented such that its major axis is parallel to the direction of displacement.

The result is reduced transversal loading of the end of the gauge 14.1 that is fixed to the elliptical suspension element.

Figure 8:
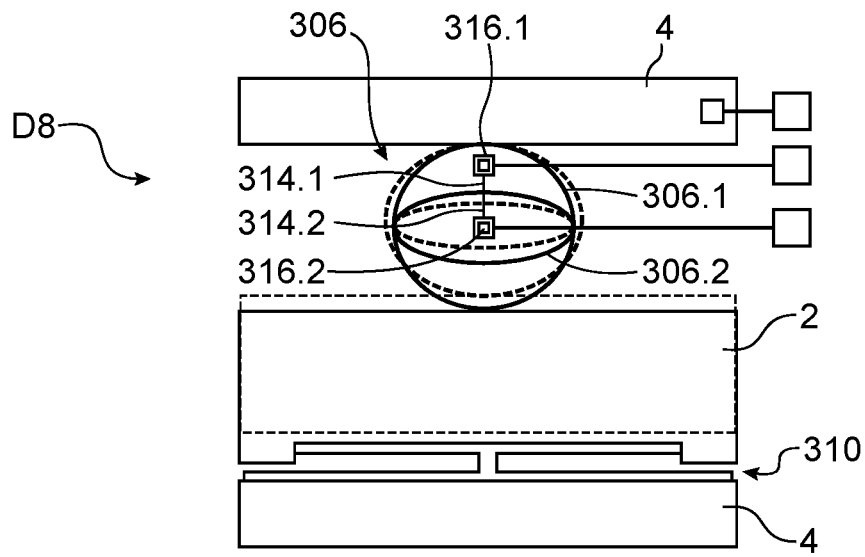
FIG. 8 is a schematically represented top view of another example of sensor according to the invention.

In FIG. 8 may be seen another example of sensor D8 according to the invention having zero transversal loading of the gauges.

The sensor D8 comprises a moveable mass 2, a fixed part 4 with respect to the substrate, first suspension means 306 between a first fixed part 4 and the mass 2 and second suspension means 310 between the mass and a second fixed part with respect to the substrate, the first and second suspension means being fixed to opposite edges of the mass.

The second suspension means 310 are for example suspension springs.

The first suspension means comprise a first elliptically shaped element 306.1 and a second elliptically shaped element 306.2.

The first elliptically shaped element 306.1 is fixed to the fixed part 4 and to the mass at the level of the ends of its minor axis b, and ensures the suspension of the mass from the fixed part 4 with respect to the substrate.

The second elliptically shaped element 306.2 is arranged in the first elliptically shaped element 306.1 and is fixed thereto such that a deformation of the first element 306.1 causes a deformation of the second element 306.2.

In the example represented, the first element 306.1 has at rest substantially the shape of a circle.

The ends of the major axis of the second element 306.2 are fixed to the ends of the major axis of the first element 306.1.

Moreover, gauges 314.1, 314.2 are suspended between one end of the minor axis of the second element 306.2 and anchoring pads 316.1, 316.2. They are also arranged such that, when one is traction loaded, the other is compression loaded. Moreover, the gauges are aligned with the direction of displacement of the mass to measure.

The gauges are connected to electrical contacts and are differentially connected.

Thus, when the mass is displaced along the direction Y (upwards in the representation of FIG. 8), the first element 306.1 contracts along the direction Y and lengthens along the direction X, which has the effect of lengthening the second element along the direction X and contracting the second element along the direction Y loading one of the gauges in traction and the other gauge in compression. The elements 306.1, 306.2 represented in dotted lines are the elements 306.1, 306.2 in a deformed state.

This example has the advantage of reducing, or even eliminating, transversal loadings of the gauge or gauges. Indeed, thanks to this structure of suspension means, the gauges are subjected to a strain along their longitudinal axis. The result is a quasi-homogenous, or even homogenous, strain in the whole volume of the gauges as well as at the level of their anchoring points. The robustness is then enhanced. The result is a homogeneous variation in resistivity in the gauges. The current is thus distributed in a homogenous manner in the gauges and the linearity of the piezoresistive response is improved.

Moreover, this structure of suspension means makes it possible to dissociate the variables, which makes it possible to dimension independently the gauges and the mass.

Figure 9:
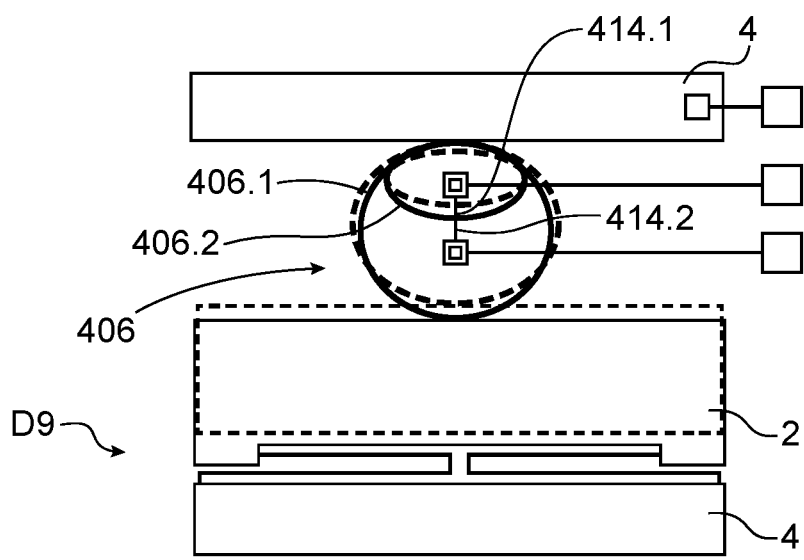
FIG. 9 is a schematically represented top view of a variant of the sensor of FIG. 8.

In FIG. 9 may be seen a device D9 according to a variant of the device D8.

The suspension means of the sensor D9 comprise suspension means 406 including a first elliptically shaped element 406.1 and a second elliptically shaped element 406.2 arranged in the first element 406.1. One end of the minor axis of the second element 406.2 is at least fixed to one end of the minor axis of the first element 406.1. In the example represented, the contours of the first and second elements 406.1, 406.2 are merged in part. But an integral joining at the level of the ends of the small axes only does not go beyond the scope of the present invention.

As for the sensor D8, the gauges 414.1, 414.2 are suspended between one end of the minor axis of the second element 406.2 and the anchoring pads 416.1, 416.2. They are also arranged such that, when one is traction loaded, the other is compression loaded.

Moreover, the gauges are aligned with the direction of displacement of the mass to detect.

The operation is similar to that of the sensor D8, the gauges are loaded essentially along their longitudinal axis offering a more robust sensor and a more linear response.

Figure 10:
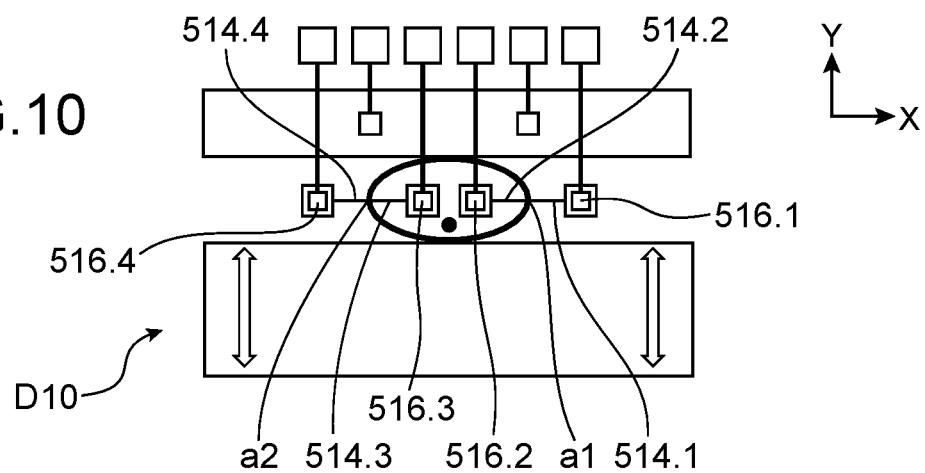
FIG. 10 is a schematically represented top view of another example of sensor according to the invention.

In FIG. 10 may be seen another example of sensor D10 according to the invention.

The sensor D10 comprises a structure similar to the sensor D1. It differs therefrom in that four gauges 514.1, 514.2, 514.3, 514.4 are implemented.

A pair of gauges 514.1, 514.2 is suspended between one end a1 of the major axis of the elliptically shaped element and the anchoring pads 516.1, 516.2. A pair of gauges 514.3, 514.4 is suspended between one end a2 of the major axis of the elliptically shaped element and the anchoring pads 516.3, 516.4.

The two pairs of gauges are arranged symmetrically with respect to the minor axis. The structure is then mechanically balanced.

In the example represented, all the gauges are electrically connected to electrical contacts and may serve for detection. The sensor may use the signals generated by the two pairs of gauges or only the signals generated by one of the pairs of gauges. In a variant, only the gauges of one of the pairs are electrically connected to electrical contacts and are used for the measurement.

Figure 11:
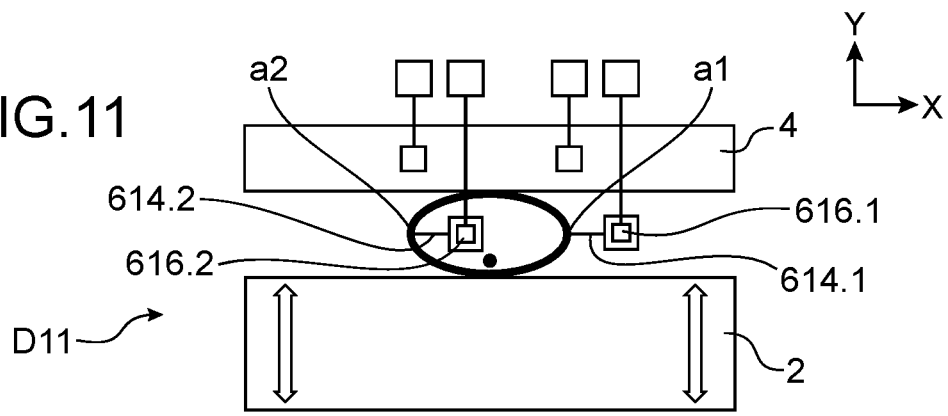
FIG. 11 is a schematically represented top view of a variant of the sensor of FIG. 10, FIGS. 12A to 12C are schematically represented top views of other examples of sensors according to the invention implementing several masses.

In FIG. 11 may be seen another example of sensor D11 having a balanced structure.

In this example, the sensor D11 comprises a gauge 614.1 suspended between the end a1 of the major axis of the elliptically shaped element and an anchoring pad 616.1 situated outside of the elliptically shaped element, and a gauge 614.2 suspended between the other end a2 of the major axis of the elliptically shaped element and an anchoring pad 616.2 situated inside the elliptically shaped element. The two gauges are electrically connected differentially.

When the mass is displaced along the Y axis, the deformation of the elliptically shaped element applies traction on one of the gauges and compression on the other gauge.

It is possible to envisage, for the sensors D10 and D11, that only one of the two gauges serves for the measurement, the other gauge being implemented to mechanically balance the structure.

Figure 12A:
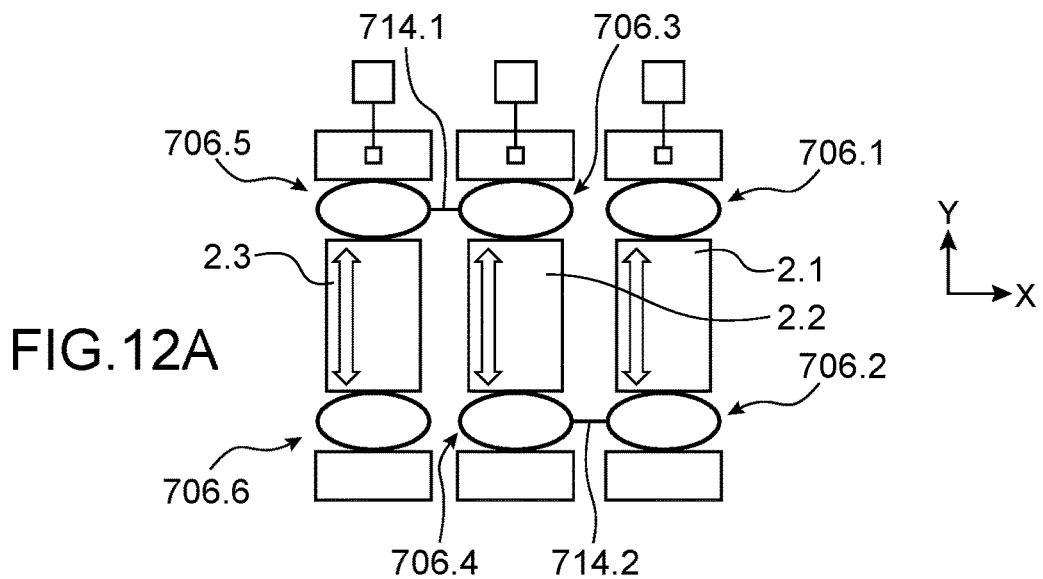
Figure 12B:
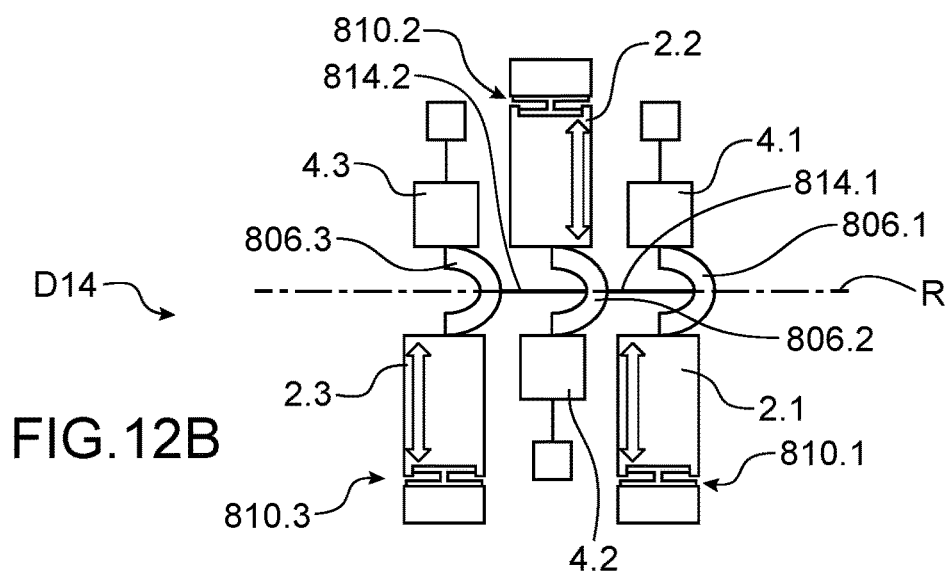
Figure 12C:
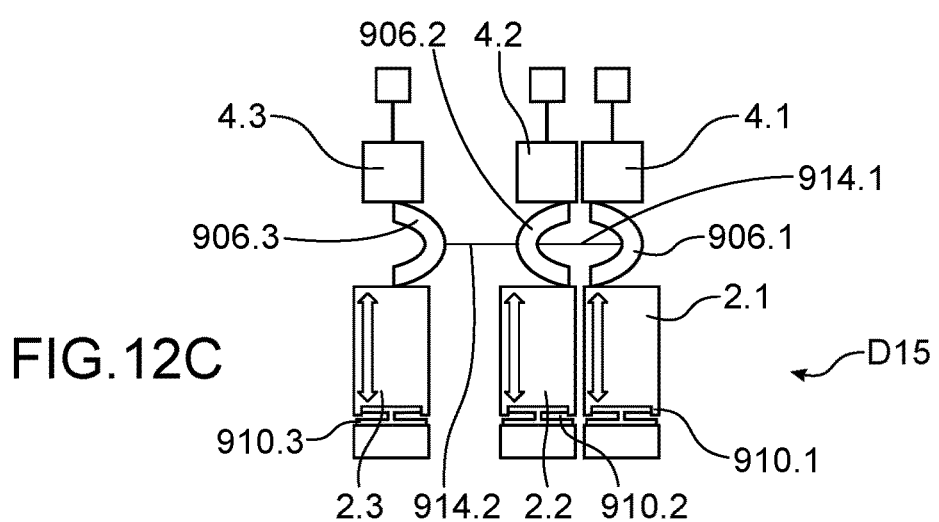

In FIGS. 12A to 12C may be seen other examples of sensors according to the invention implementing several masses.

In FIG. 12A, the sensor D13 comprises three masses 2.1, 2.2, 2.3.

The mass 2.1 is suspended from the fixed part by two suspension means 706.1, 706.2 each comprising an elliptically shaped element.

The mass 2.2 is suspended from the fixed part by two suspension means 706.3, 706.4 each comprising an elliptically shaped element.

The mass 2.3 is suspended from the fixed part by two suspension means 706.5, 706.6 each comprising an elliptically shaped element.

The sensor also comprises means for measuring the displacement of the moveable masses. The masses are identical and when they are subjected to an external force they undergo the same displacement.

The measuring means comprise a first gauge suspended 714.1 between the suspension means 706.5 and the suspension means 706.3, the gauge 714.1 being aligned with the large axes of the suspension means 706.5, 706.3.

The measuring means comprise a second gauge 714.2 suspended between the suspension means 706.4 and the suspension means 706.2, the gauge 714.2 being aligned with the large axes of the suspension means 706.4, 706.2.

When the masses 2.1, 2.2, 2.3 are displaced along the Y axis, downwards in the representation of FIG. 12A, the gauge 714.1 is stretched, whereas the gauge 714.2 is compressed, enabling a differential measurement.

In this example the gauges 714.1, 714.2 do not undergo or undergo little transversal loading since the two ends of the gauges are displaced simultaneously and in the same sense along the direction Y.

In FIG. 12B may be seen another example of sensor D14 also comprising three masses 2.1, 2.2, 2.3.

In this example, each mass is suspended from a fixed part with respect to the substrate 4.1, 4.2, 4.3 by a suspension means 806.1, 806.2, 806.3 according to the invention and by a suspension means 810.1, 810.2, 810.3 of the prior art. It will be understood that all the suspension means could be according to the invention, or a part only. The fixed parts 4.1, 4.2, 4.3 are immobile with respect to each other and generally in one piece.

In this example, the suspension means 806.1, 806.2, 806.3 comprise an element of half-ellipse shape. The three half-ellipses have the same orientation and their large axes are aligned.

By considering the plane R passing through the large axes of the half-ellipses and extending along the out-of-plane direction, the mass 2.2 situated between the two masses 2.1 and 2.3 is situated on the other side of the plane R with respect to the masses 2.1 and 2.3, and the fixed part 4.2 to which is connected the mass 2.2 is situated on the other side of the plane R with respect to the fixed parts 4.1 and 4.3. Thus, when the masses are displaced along the Y axis in a given sense, the masses 2.1, 2.3 move away from or come closer to the fixed parts 4.1, 4.3 whereas the mass 2.2 comes closer to or moves away from the fixed part 4.2 respectively.

The device comprises detection means comprising a gauge 814.1 suspended between the suspension means 806.1 and 806.2 and the gauge 814.2 suspended between the suspension means 806.2 and 806.3. Moreover, the gauges are aligned with the large axes of the half-ellipses.

For example, when the masses undergo a displacement, downwards in the representation of FIG. 12B, the gauge 814.1 is subjected to a compressive force and the gauge 814.2 is subjected to a traction force.

In this example, the gauges 814.1, 814.2 do not undergo or undergo little transversal loading, since the two ends of the gauges are displaced simultaneously and in the same sense along the direction Y.

In FIG. 12C may be seen another example of sensor D15 also comprising three masses 2.1, 2.2, 2.3.

The masses have the same arrangement as for the device D13.

In this example, each mass is suspended from the fixed parts with respect to the substrate 4.1, 4.2, 4.3 by a suspension means 906.1, 906.2, 906.3 according to the invention and by a suspension means 910.1, 910.2, 910.3 of the prior art. It will be understood that all the suspension means could be according to the invention, or a part only.

In this example, the suspension means 906.1, 906.2, 906.3 comprise an element of half-ellipse shape.

The half-ellipses 906.1 and 906.2 are symmetrical with each other so as to form an ellipse.

The half-ellipse 906.3 has the same orientation as the half-ellipse 906.1.

The device comprises detection means comprising a gauge 914.1 suspended between the suspension means 906.1 and 906.2 and a gauge 914.2 suspended between the suspension means 906.2 and 906.3. Moreover, the gauges are aligned with the large axes of the half-ellipses.

For example, when the masses undergo a displacement, downwards in the representation of FIG. 12C, the gauge 914.1 is subjected to a compressive force and the gauge 914.2 is subjected to a traction force.

In this example, the gauges 914.1, 914.2 do not undergo or undergo little transversal loading since the two ends of the gauges are loaded simultaneously and in the same sense along the direction Y.

The sensors according to the invention may be used as pressure sensor, accelerometer, gyrometer, magnetometer, etc.

Figure 14:
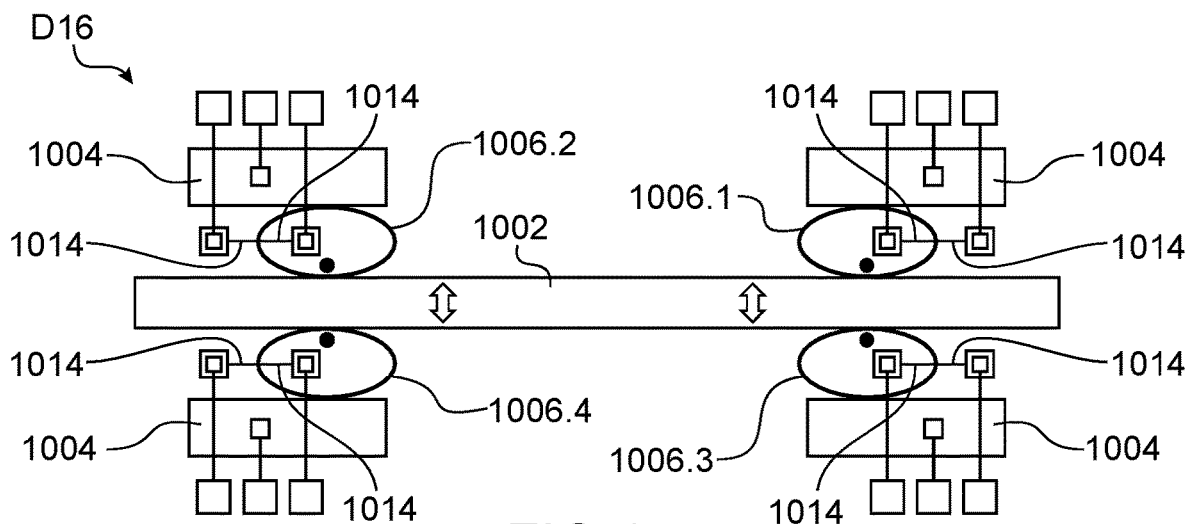
FIG. 14 is a schematically represented side view of an exemplary embodiment of a microphone according to the invention.

In FIG. 14 may be seen an example of microphone D16 implementing suspension means according to the invention.

The microphone D16 comprises a diaphragm 1002 suspended from a fixed part 1004 by four suspension means 1006.1, 1006.2, 1006.3, 1006.4.

The four suspension means have an elliptical shape.

Moreover, it comprises means for detecting the displacement of the diaphragm. The detection means comprise strain gauges 1014 such as those implemented in the device D3.

In this example, detection means are provided at the level of each suspension means, but a single detection means could be provided on each edge of the diaphragm.

Figure 15:
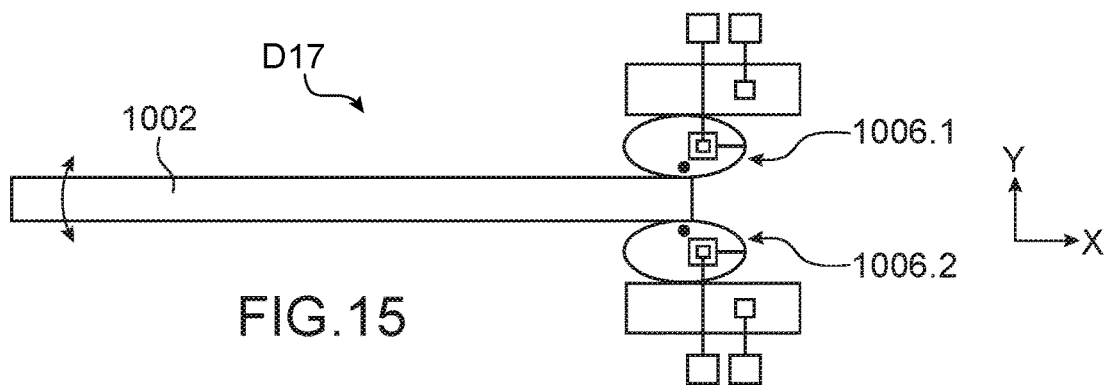
FIG. 15 is a schematically represented side view of another exemplary embodiment of microphone according to the invention.

In FIG. 15 may be seen another example of microphone D17 implementing suspension means according to the invention. The microphone D17 differs from the microphone D16 in that the diaphragm is embedded at only one of its ends, by two suspension means 1006.1, 1006.2 on either side of the end of the diaphragm. The description of the suspension means and detection means of the microphone D16 apply. The diaphragm is rotationally displaced around its embedded end and the resulting amplitude of the signal is potentially greater with respect to the microphone D16.

Figure 16:
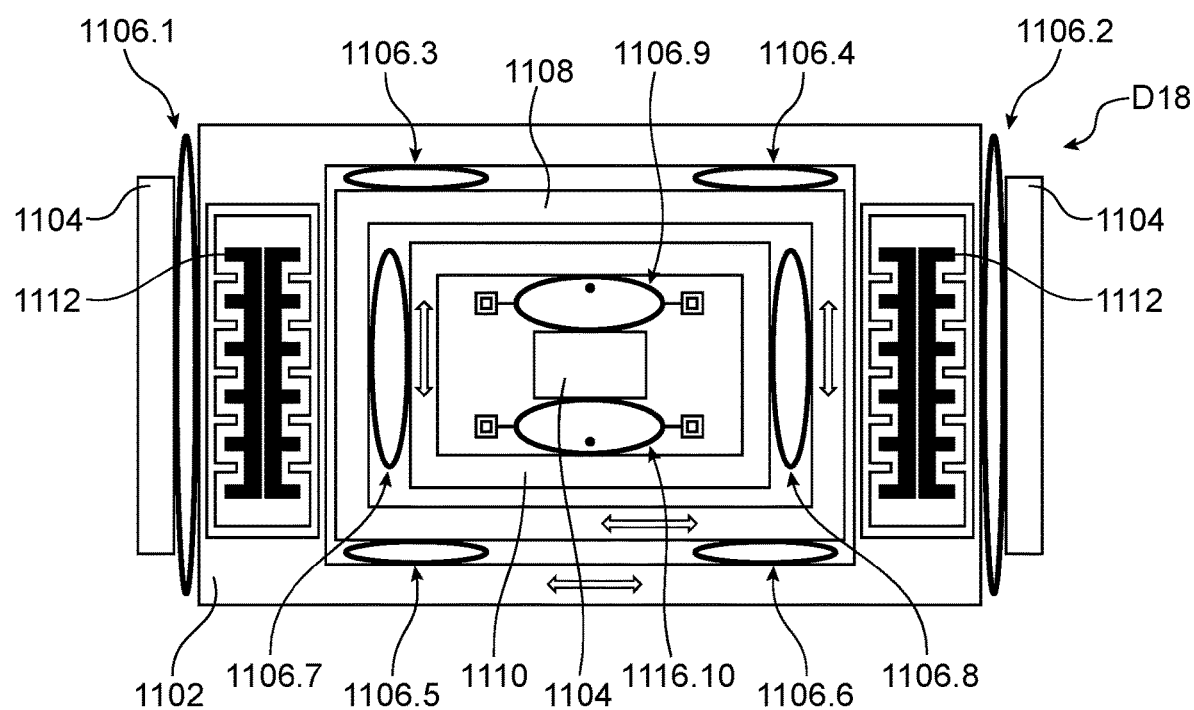
FIG. 16 is a schematically represented top view of an exemplary embodiment of a gyrometer according to the invention.

According to another exemplary embodiment, the suspension means suspend one or more moveable parts from at least one other moveable part. In FIG. 16 may be seen an example of gyrometer D18 implementing suspension means according to the invention between moveable parts.

The gyrometer D18 implements suspension means between its different constituent elements. The gyrometer comprises a suspended part 1102 intended for the excitation of the gyrometer, it is suspended from two fixed parts 1104 by two suspension means 1106.1, 1106.2 according to the invention, oriented so as to favour displacement along the direction X.

The gyrometer comprises a moveable part 1108 sensitive to Coriolis forces suspended from the excitation part 1102 inside it, by four suspension means 1106.3, 1106.4, 1106.5, 1106.6, oriented so as to favour displacement of the frame 1108 along the direction Y while subjecting it to the displacements in X of the excitation part 1002.

The gyrometer comprises a detection part 1110 suspended between the sensitive part 1108 by two suspension means 1106.7, 1106.8, and from the fixed part 1104 by two suspension means 1106.9, 1106.10. The suspension means 1106.7, 1106.8 are oriented so as to favour the mechanical isolation along the direction X of the detection part with respect to the other parts and the transmission of the signal along the direction Y from the suspended part to the detection part. The suspension means 1106.9, 1106.10 are oriented such that their minor axis is parallel to the direction Y.

The gyrometer comprises piezoresistive detection means similar to those implemented in the sensor D5, but the fixed part 1104 is arranged at the centre and the gauges are outside of the ellipses. In a variant, the arrangement of the detection means in the sensor D5 may apply.

The gyrometer comprises means for making the excitation part move. In the example represented, said means are electrostatic combs with surface variation 1112. In a variant, excitation means with air-gap means are implemented.

The displacement of the different elements is symbolised by the arrows.

A gyrometer in which one part of the suspension means is according to the invention and another part comprises suspension means of the prior art does not go beyond the scope of the present invention.

The detection principle described above for the sensors could be transposed to produce actuators making the moveable mass move by replacing the piezoresistive gauges by piezoelectric materials. By implementing elliptical or semi-elliptical suspension means, it is possible to benefit advantageously from the amplification of the movement imposed by the suspension means, or potentially from the reduction in the movement.

Moreover, it is also possible to produce electrostatic, thermal actuators, etc., implementing the suspension means according to the invention.

In addition, the detection means could be for example capacitive detection means.

In addition a device comprising detection means does not necessarily form a sensor, it may be an actuator, the detection means, for example the gauges, being used to determine the displacement of the moveable part and to monitor the position of the moveable part. Other means may be used to actuate the moveable part.

Moreover, the embodiments and exemplary embodiment may be combined, notably the suspension means implemented in an example may be implemented in another example described.

Preferably, the detection means are such that they enable a differential measurement. It will be understood that detection means not enabling a differential measurement may be implemented in the devices according to the invention. For example, a single gauge could be used in the device D3. Or two gauges may then be used but only one carrying out the measurement.

In the examples described, the suspension means according to the invention directly connect the moveable part to a fixed part with respect to the substrate.

According to another exemplary embodiment, the device may comprise several suspension elements according to the invention between a fixed part with respect to the substrate and the same moveable part, for example the suspension elements being either each connected to the fixed part and to the mass, or linked together, or between two moveable parts. The suspension elements may be identical or different.

The device according to the invention is produced by microelectronic techniques implementing for example steps of lithography, etching, release.

Lithography masks adapted to the shape of the suspension elements are used.

The invention claimed is:

1. A microelectromechanical and/or nanoelectromechanical device comprising
   a fixed part,
   at least one suspended part configured to be moveable in a plane of said device with respect to the fixed part along at least one first direction, and
   a first suspension means for suspending said suspended part, said first suspension means comprising at least one suspension element, said suspension element comprising a first end fixed directly to the suspended part and a second end connected to the fixed part, said suspension element having a curved shape contained in the plane and extending between the first end and the second end, wherein
   during displacement of said suspended part in the plane, said suspension element is only deformed elastically,
   said at least one suspension element is at least of half-ellipse shape, and
   the device comprises at least one strain gauge having ends, wherein one of the ends is fixed on the suspension element and another one of the ends is anchored on the fixed part with respect to a substrate.

2. The device according to claim 1, wherein the first suspension means comprises two suspension elements, each of half-ellipse shape, and arranged with respect to each other so as to form an ellipse.

3. The device according to claim 2, comprising at least two strain gauges, one of the ends of one gauge being fixed on a first one of the two suspension elements and the other end of the one gauge being anchored on the fixed part with respect to the substrate, and one of the ends of other gauge being fixed on a second one of the two suspension elements and another end of the other gauge being anchored on the fixed part with respect to the substrate.

4. The device according to claim 1, comprising
a second suspension means comprising at least one element for suspending said suspended part from said fixed part, said suspension element comprising a first end fixed directly to the suspended part, and a second end connected to the fixed part, said suspension element having a curved shape contained in the plane, and extending between the first end and the second end and such that, during the displacement in the plane of said suspended part, said suspension element is only deformed elastically, said second suspension means being arranged with respect to the at least one suspended part configured to be moveable and to the first suspension means, such that, during a displacement of the moveable part, when the first suspension means is deformed in compression, the second suspension means is deformed in traction and vice versa.

5. The device according to claim 4, wherein
at least one of the first suspension means and the second suspension means is oriented such that a major axis thereof is parallel to the first direction, and
at least one strain gauge is aligned with a minor axis, such that a moveable end of the strain gauge undergoes a displacement amplified with respect to that of the moveable part.

6. The device according to claim 4, wherein
at least one of the first suspension means and the second suspension means comprises a first elliptically shaped element and a second elliptically shaped element arranged in the first elliptically shaped element and mechanically connected thereto, the first elliptically shaped element being fixed on the moveable part and the second elliptically shaped element being fixed only on the first elliptically shaped element, and
at least one strain gauge is fixed to the second elliptically shaped element.

7. The device according to claim 4, wherein
the first suspension means and of the second suspension means comprise two suspension elements, each of half-ellipse shape, and arranged with respect to each other so as to form an ellipse and in which at least one of the first suspension means and the second suspension means is oriented such that major axis thereof is parallel to the first direction, and
at least one strain gauge is aligned with the minor axis, such that the moveable end of the strain gauge undergoes a displacement amplified with respect to that of the moveable part.

8. The device according to claim 4, comprising several moveable parts, each moveable part being connected to the fixed part with respect to the substrate by at least one first suspension means, and in which at least one strain gauge is suspended between two first suspension means.

9. The device according to claim 1, comprising at least two strain gauges each being fixed to a suspension element.

10. The device according to claim 1, comprising
several moveable parts, each moveable part being connected to the fixed part with respect to the substrate by at least one first suspension means, and
at least one strain gauge suspended between two first suspension means.

11. A sensor comprising at least one device according to claim 1, and comprising a detector for detecting displacement of the moveable part.

12. The sensor according to claim 11, in which the detector comprises at least one strain gauge, said strain gauge being a piezoresistive gauge.

13. The sensor according to claim 11, comprising two strain gauges differentially connected and being arranged such that, when one undergoes a compression, the other undergoes a traction.

14. The sensor according to claim 11, forming a microphone, in which the moveable part is a diaphragm.

15. The sensor according to claim 11, forming an accelerometer, in which the moveable part is sensitive to the forces resulting from an acceleration.

16. The sensor according to claim 11, forming a gyrometer, comprising several parts suspended by suspension elements of curved shape.

17. An actuator comprising at least one device according to claim 1, and comprising a mechanism for displacing the suspended part.

* * * * *